[12] United States Patent
Kang et al.

(10) Patent No.: US 10,374,580 B2
(45) Date of Patent: Aug. 6, 2019

(54) FIR FILTER CIRCUIT DESIGN METHOD USING APPROXIMATE COMPUTING

(71) Applicant: UNIST(ULSAN NATIONAL INSTITUTE OF SCIENCE AND TECHNOLOGY), Ulsan (KR)

(72) Inventors: Seokhyeong Kang, Ulsan (KR); Yesung Kang, Ulsan (KR)

(73) Assignee: UNIST(USLAN NATIONAL INSTITUTE OF SCIENCE AND TECHNOLOGY), Uslan (KR)

( * ) Notice: Subject to any disclaimer, the term of this patent is extended or adjusted under 35 U.S.C. 154(b) by 0 days.

(21) Appl. No.: 15/883,104

(22) Filed: Jan. 30, 2018

(65) Prior Publication Data

US 2018/0226953 A1 Aug. 9, 2018

(30) Foreign Application Priority Data

Feb. 6, 2017 (KR) .................. 10-2017-0016179

(51) Int. Cl.
*H03H 17/02* (2006.01)
*H03H 17/06* (2006.01)
*H03H 17/00* (2006.01)

(52) U.S. Cl.
CPC .... *H03H 17/0238* (2013.01); *H03H 17/0223* (2013.01); *H03H 17/06* (2013.01); *H03H 2017/0081* (2013.01); *H03H 2017/0245* (2013.01)

(58) Field of Classification Search
CPC .............. H03H 2017/0081; H03H 2017/0245
See application file for complete search history.

(56) References Cited

FOREIGN PATENT DOCUMENTS

KR 10-0294541 B1 4/2001

OTHER PUBLICATIONS

N. Zhu et al., Design of Low-Power High-Speed Truncation-Error-Tolerant Adder and Its Application in Digital Signal Processing, IEEE Transactions on Very Large Scale Integration (VLSI) Systems, vol. 18, No. 8, p. 1225-1229, 2010 (Year: 2010).*
J. Miao et al., Modeling and Synthesis of Quality-Energy Optimal Approximate Adders, IEEE/ACM International Conference on Computer-Aided Design (IDDAD), p. 728-735, 2012 (Year: 2012).*

(Continued)

*Primary Examiner* — Andrew Caldwell
*Assistant Examiner* — Emily E Larocque
(74) *Attorney, Agent, or Firm* — Revolution IP, PLLC (57) ABSTRACT

A finite impulse response (FIR) filter circuit design method using approximate computing, the FIR filter circuit design method including: replacing adders of the FIR filter with approximate adders; and performing a synthesis work according to a set approximate synthesis flow when the replacing of the adders of the FIR filter are replaced with the approximate adders is performed, wherein, in the approximate synthesis flow, a numeric column of each of the approximate adders is divided into an accurate part and an inaccurate part, and a numeric column of the inaccurate part is approximated. In the FIR filter, conventional adders/subtractors are replaced with addition/subtraction having an automated synthesis flow so that energy consumption can be reduced.

7 Claims, 8 Drawing Sheets

(56) References Cited

OTHER PUBLICATIONS

K.B. Priya et al., Performance Analysis of Dadda Multiplier using 5:2 Compressor and its Applications, International Journal of Advanced Information Science and Technology (IJAIST) ISSN:2319:2682, vol. 5, No. 4, p. 72-78, 2016 (Year: 2016).*
N. Maheshwari, Approximate Computing and its Applications,http://namanmaheshwari.in/docs/GuestTalk.pdf, Aug. 6, 2016 (Year: 2016).*
Wei-Ting J. Chan et al., "Statistical Analysis and Modeling for Error Composition in Approximate Computation Circuits", 978-1-4799-2987-0/13/$31.00 © 2013 IEEE, pp. 47-53.
Ning Zhu et al., "An Enhanced Low-Power High-Speed Adder for Error-Tolerant Application", ISIC 2009, p. 69-72, IEEE.
Yesung Kang et al., "Novel Approximate Synthesis Flow for Energy-efficient FIR Filter", 2016 IEEE 34th International Conference on Computer Design (ICCD), Oct. 2-5, 2016.
Malcolm D. Macleod et al., "Multiplierless FIR Filter Design Algorithms", IEEE Signal Processing Letters, vol. 12, No. 3, Mar. 2005.
Chia-Yu Yao et al., "A Novel Common-Subexpression-Elimination Method for Synthesizing Fixed-Point FIR Filters", IEEE Transactions on Circuits and Systems—I: Regular Papers, vol. 51, No. 11, Nov. 2004.
Jung Hwan Choi et al., "Variation-Aware Low-Power Synthesis Methodology for Fixed-Point FIR Filters", IEEE Transactions on Computer-Aided Design of Integrated Circuits and Systems, vol. 28, No. 1, Jan. 2009.
Vaibhav Gupta et al., "IMPACT: IMPrecise adders for low-power Approximate CompuTing", 978-1-61284-660-6/11/$26.00 © 2011 IEEE, pp. 409-414.
Shih-Lien Lu, "Speeding Up Processing with Approximation Circuits", Computer (vol. 37, Issue: 3, Mar. 2004), pp. 67-73, IEEE Computer Society.
Ajay K. Verma et al., "Variable Latency Speculative Addition: A New Paradigm for Arithmetic Circuit Design", 978-3-9810801-3-1/DATE08 © 2008 EDAA.
Doochul Shin et al., "A Re-Design Technique for Datapath Modules in Error Tolerant Applications", Asian Test Symposium, Nov. 24-27, 2008, pp. 431-437, IEEE.
Andrew B. Kahng et al., "Accuracy-Configurable Adder for Approximate Arithmetic Designs", DAC 2012, Jun. 3-7, 2012, San Francisco, California, USA, IEEE.
Rangharajan Venkatesan et al., "MACACO: Modeling and Analysis of Circuits for Approximate Computing", 78-1-4577-1400-9/11/$26.00 © 2011 IEEE, Nov. 7-10, 2011, pp. 667-673.
Parag Kulkarni et al., "Trading Accuracy for Power with an Underdesigned Multiplier Architecture", 2011 24th Internatioal Conference on VLSI Design, pp. 346-351, IEEE.
Kyung-Ju Cho et al., "Design of Low-Error Fixed-Width Modified Booth Multiplier", IEEE Transactions on Very Large Scale Integration (VLSI) Systems, vol. 12, No. 5, May 2004.
Chip-Hong Chang et al., "A Low Error and High Performance Multiplexer-Based Truncated Multiplier", IEEE Transactions on Very Large Scale Integration (VLSI) Systems, vol. 18, No. 12, Dec. 2010.
Jiun-Ping Wang et al., "High-Accuracy Fixed-Width Modified Booth Multipliers for Lossy Applications", IEEE Transactions on Very Large Scale Integration (VLSI) Systems, vol. 19, No. 1, Jan. 2011.
Cong Liu et al., "A Low-Power, High-Performance Approximate Multiplier with Configurable Partial Error Recovery", 978-3-9815370-2-4/DATE14/c 2014 EDAA.
Farzad Farshchi et al., "New Approximate Multiplier for Low Power Digital Signal Processing", 978-1-4799-0565-2/13/$31.00 © 2013 IEEE, pp. 25-30.
David J. Goodman et al., "Nine Digital Filters for Decimation and interpolation", IEEE Transactions on Acoustics, Speech, and Signal Processing, vol. ASSP-29, No. 2, Apr. 1977.
Fei Xu et al., "Design of Low-Complexity FIR Filters Based on Signed-Powers-of-Two Coefficients With Reusable Common Subexpressions", IEEE Transactions on Computer-Aided Design of Integrated Circuits and Systems, vol. 26, No. 10, Oct. 2007.
Kenny Johansson, "Low Power and Low Complexity Shift-and-Add Based Computations", Linkoping Studies in Science and Technology Dissertations, No. 1201.
Dong Shi et al., "Design of Linear Phase FIR Filters With High Probability of Achieving Minimum Number of Adders", IEEE Transactions on Circuits and Systems—I: Regular Papers, vol. 58, No. 1, Jan. 2011.
Vagner S. Rosa et al., "An Improved Synthesis Method for Low Power Hardwired FIR Filters", SBCCI'04, Sep. 1-11, 2004, Pernambuco, Brazil, pp. 237-241.

* cited by examiner

FIG. 1

-RELATED ART-

FIG. 7 original
(a)

Baseline design
(b)

Proposed
PSNR = 46.3
30.0% Energy reduced
(c)

89.2% Accuracy
PSNR = 40.6
36.9% Energy reduced
(d)

65.4% Accuracy
PSNR = 14.7
45.7% Energy reduced
(e)

45.6% Accuracy
PSNR = −9.5
48.8% Energy reduced
(f)

FIR FILTER CIRCUIT DESIGN METHOD USING APPROXIMATE COMPUTING

CROSS-REFERENCE TO RELATED PATENT APPLICATIONS

This application claims the benefit of Korean Patent Application No. 10-2017-0016179, filed on Feb. 6, 2017, in the Korean Intellectual Property Office, the disclosure of which is incorporated herein in its entirety by reference.

BACKGROUND OF THE INVENTION

1. Field of the Invention

The present invention relates to a finite impulse response (FIR) filter circuit design method using approximate computing, and more particularly, to an FIR filter circuit design method using approximate computing, whereby an FIR filter applied to an image processing application, etc. is approximated so that power consumption can be reduced.

2. Description of the Related Art

As semiconductor technologies continue to develop, electronic devices are becoming smaller and more portable. Consequently, as the battery size of Internet of Things (IoT) devices decreases and power consumption increases, the urgent need for energy efficient systems has generated research interests in approximate computing techniques.

A finite impulse response (FIR) filter shows better phase linearity and stability than an infinite impulse response (IIR) filter. However, because the FIR filter consumes more power due to a complex design thereof, the overall energy efficiency of a system is reduced. Thus, in order to improve the energy efficiency of the FIR filter, several proposals have sought to reduce their design complexity. However, these approach only focused on reducing the number of adder steps, providing an accuracy estimation model, or developing an approximate adder, separately.

Figure 1:
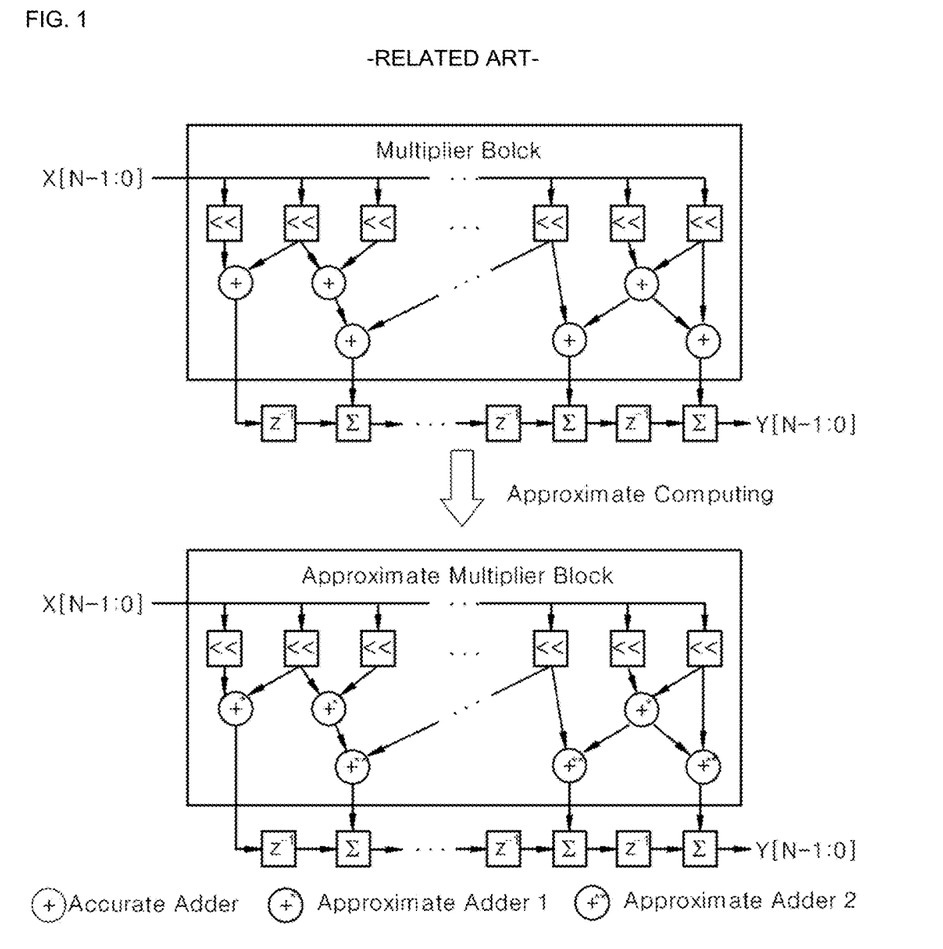
FIG. 1 is a view of a multiply-and-accumulate (MAC) structure of a conventional finite impulse response (FIR) filter.

FIG. 1 shows a multiply-and-accumulate (MAC) structure of a conventional FIR filter. In order to reduce complexity of the FIR filter, an FIR filter in which multiplication is implemented with shifters and adders rather than multipliers, is generally used. First, integer coefficients are transformed into a proper one for shift and addition operations. In conventional FIR filters, all coefficients are expressed in signed-power-of-two (SPT) space rather than signed binary, since SPT can reduce the number of nonzero digits. In the SPT codes, a canonical signed digit (CSD) code is well known to effectively reduce the complexity of FIR filters.

Another key idea in conventional FIR filters is a common subexpression elimination (CSE) algorithm. Yao et al. proposed a CSE algorithm to reduce redundancy among CSD coefficients. Choi et al. analyzed the criticality of each coefficient of an FIR filter and applied tighter constraints on more critical coefficients during the CSE algorithm. Choi's FIR filter yielded 25% to 30% power saving at low voltages with minor passband/stopband ripples. Kahng et al. implemented an FIR filter using an approximation at the synthesis level. They replaced certain modules with approximated ones based on lookup tables in order to reduce power consumption with only a small degradation in the quality of output. Gupta et al. implemented an FIR filter using an approximated circuit. They proposed mathematical models for error and the power consumption of the approximate adders. However, Yao et al. and Malcolm et al. only focused on reducing the number of adder steps. Also, Choi et al. considered voltage scaling to save power, but the errors incurred along the critical path were observed to usually be more critical than those due to approximations. Kahng et al. and Gupta et al. applied approximate computing to an FIR filter but did not provide any automated synthesis flow for the approximation. If the size of the design of the FIR filter becomes larger, it becomes difficult to find optimum configurations for the approximate adders.

As mentioned above, in the conventional FIR filter circuit design method, accuracy is reduced due to the errors incurred by approximations, and large power consumptions is required.

SUMMARY OF THE INVENTION

The present invention provides a finite impulse response (FIR) filter circuit design method using approximate computing, whereby an FIR filter applied to an image processing application, etc. is approximated so that an acceptable level of accuracy can be attained and power consumption can be reduced.

According to an aspect of the present invention, there is provided a finite impulse response (FIR) filter circuit design method using approximate computing, the FIR filter circuit design method including: replacing adders of the FIR filter with approximate adders; and performing a synthesis work according to a set approximate synthesis flow when the replacing of the adders of the FIR filter are replaced with the approximate adders is performed, wherein, in the approximate synthesis flow, a numeric column of each of the approximate adders is divided into an accurate part and an inaccurate part, and a numeric column of the inaccurate part is approximated.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, example embodiments of the present invention will be described in more detail with reference to the attached drawings.

Figure 2:
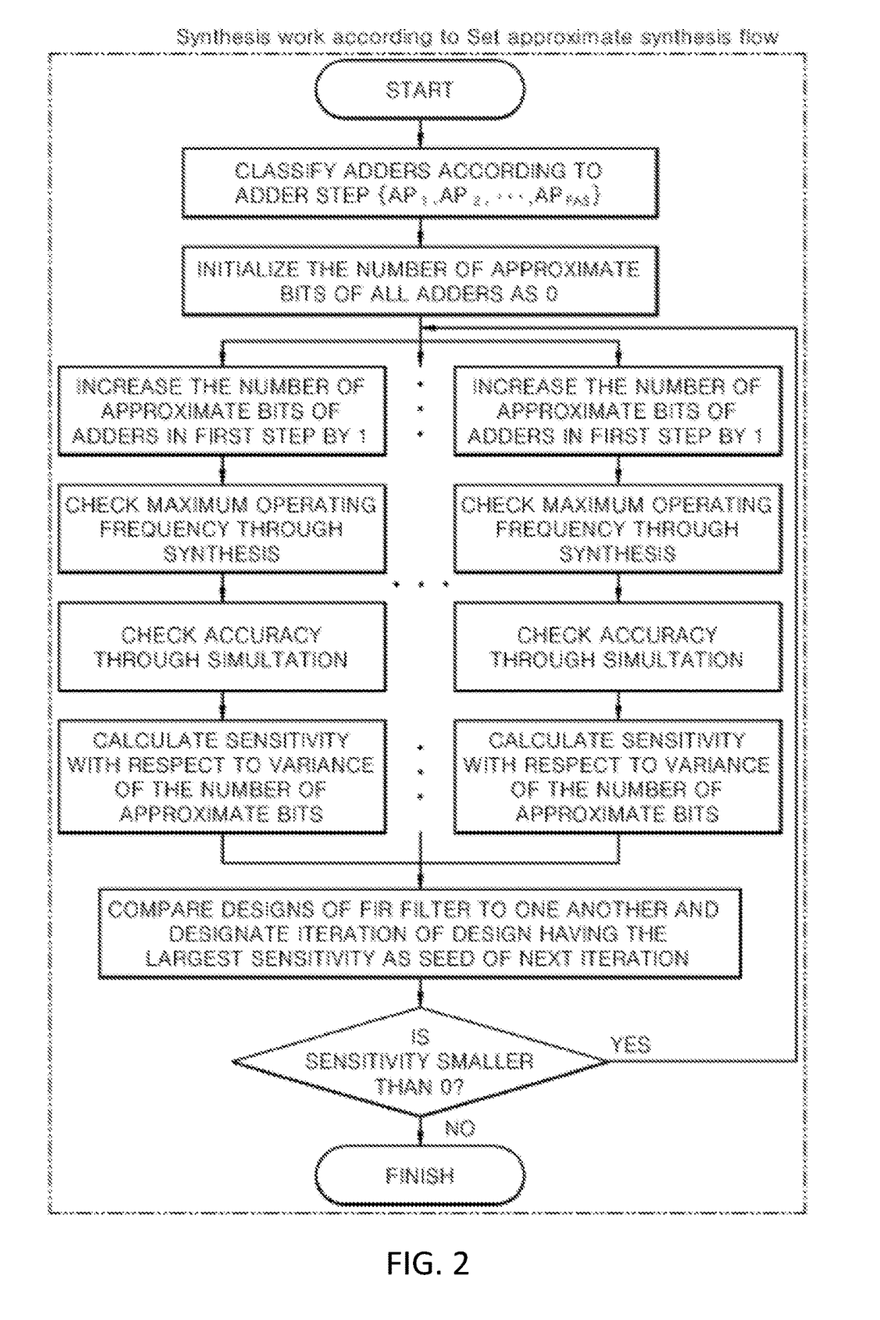
FIGS. 2, 3a and 3b are flowcharts illustrating an FIR filter circuit design method using approximate computing according to an embodiment of the present invention.
Figure 3A:
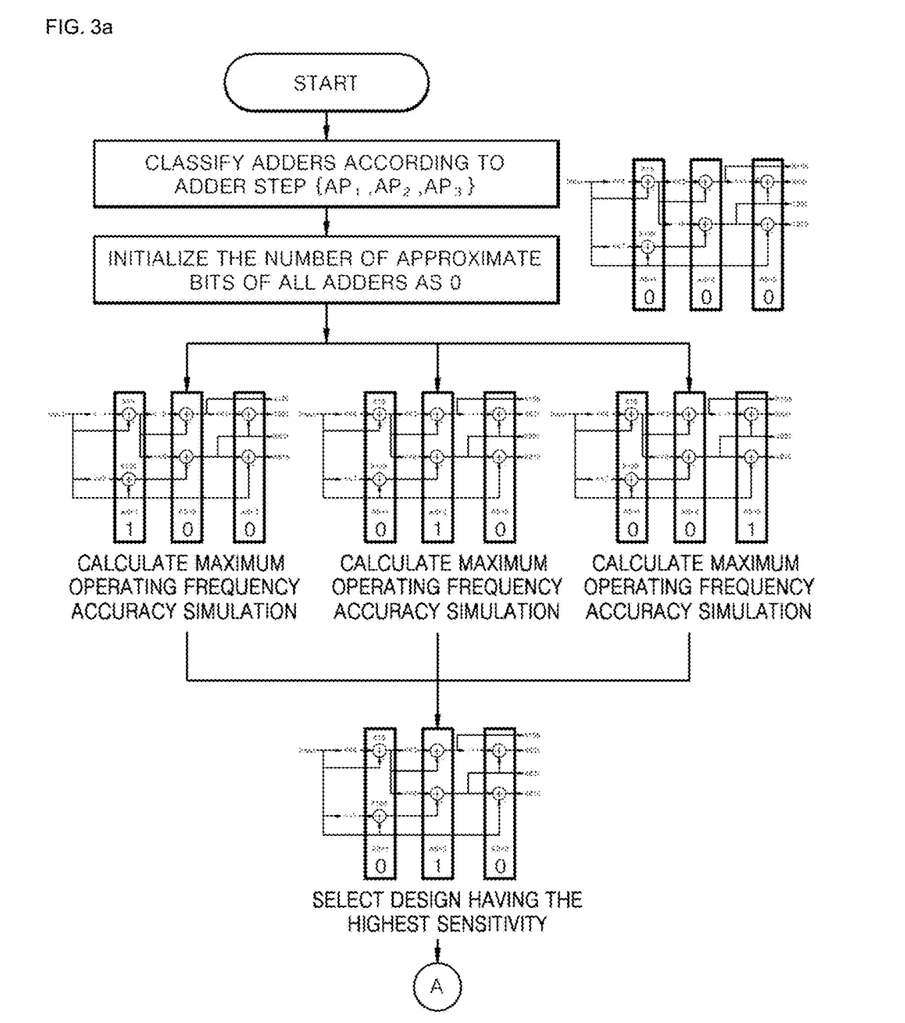
Figure 3B:
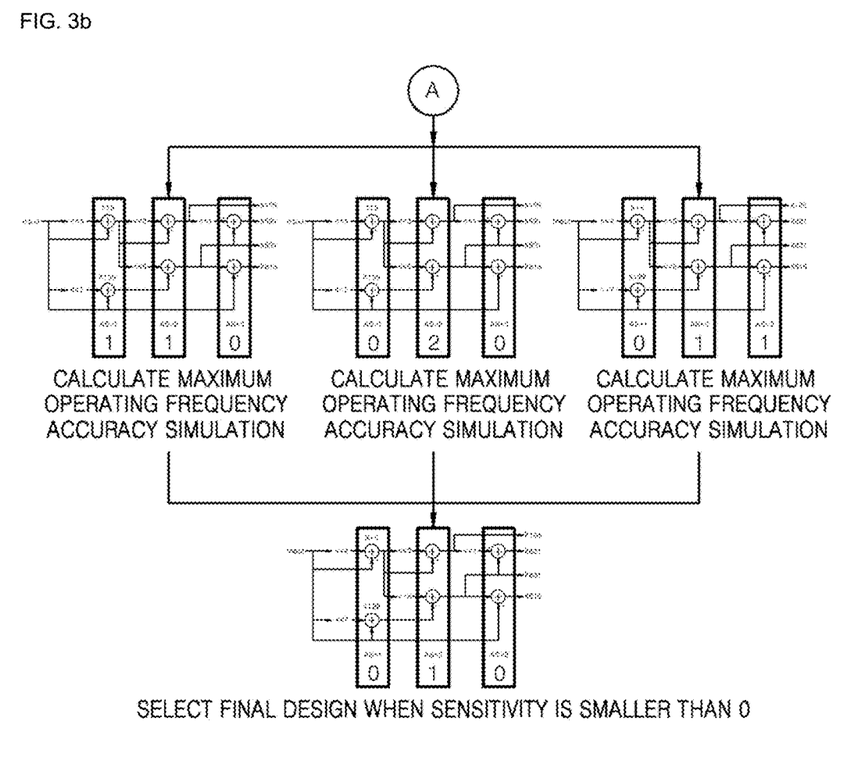

First, referring to FIGS. 2, 3a and 3b, a finite impulse response (FIR) filter circuit design method using approximate computing according to an embodiment of the present invention includes: replacing adders of an FIR filter with approximate adders and performing a synthesis work according to a set approximate synthesis flow when the replacing of the adders of the FIR filter with the approximate adders is performed.

Here, in the approximate synthesis flow, a numeric column of each of the approximate adders is divided into an accurate part and an inaccurate part, and a numeric column of the inaccurate part is approximated.

In the approximate synthesis flow, a boundary position at which the accurate part and the inaccurate part are distinguished from each other, is identically set in the same step. Here, the boundary position is set based on low energy in each step. Also, the boundary position uses a boundary position determined in the previous step. Here, energy is a power delay product (PDP) and may be integrated as the amount of energy consumption per unit calculation. Thus, the low energy means that a relatively small amount of energy is used.

In the approximate synthesis flow, accuracy is defined by Equation 1:

$$\text{accuracy} = \min_{k=1,\ldots,M}\left(1 - \frac{|\text{result}_k - \text{ref}_k|}{|\text{ref}_k|}\right) \times 100\%. \quad (1)$$

Also, in the approximate synthesis flow, a sensitivity factor (SF) is defined by Equation 2:

$$SF = \begin{cases} \dfrac{\text{accuracy} - \text{accuracy}_{min}}{\text{delay}}, & \text{if accuracy} > \text{accuracy}_{min} \\ 0, & \text{else} \end{cases} \quad (2)$$

Figure 7:
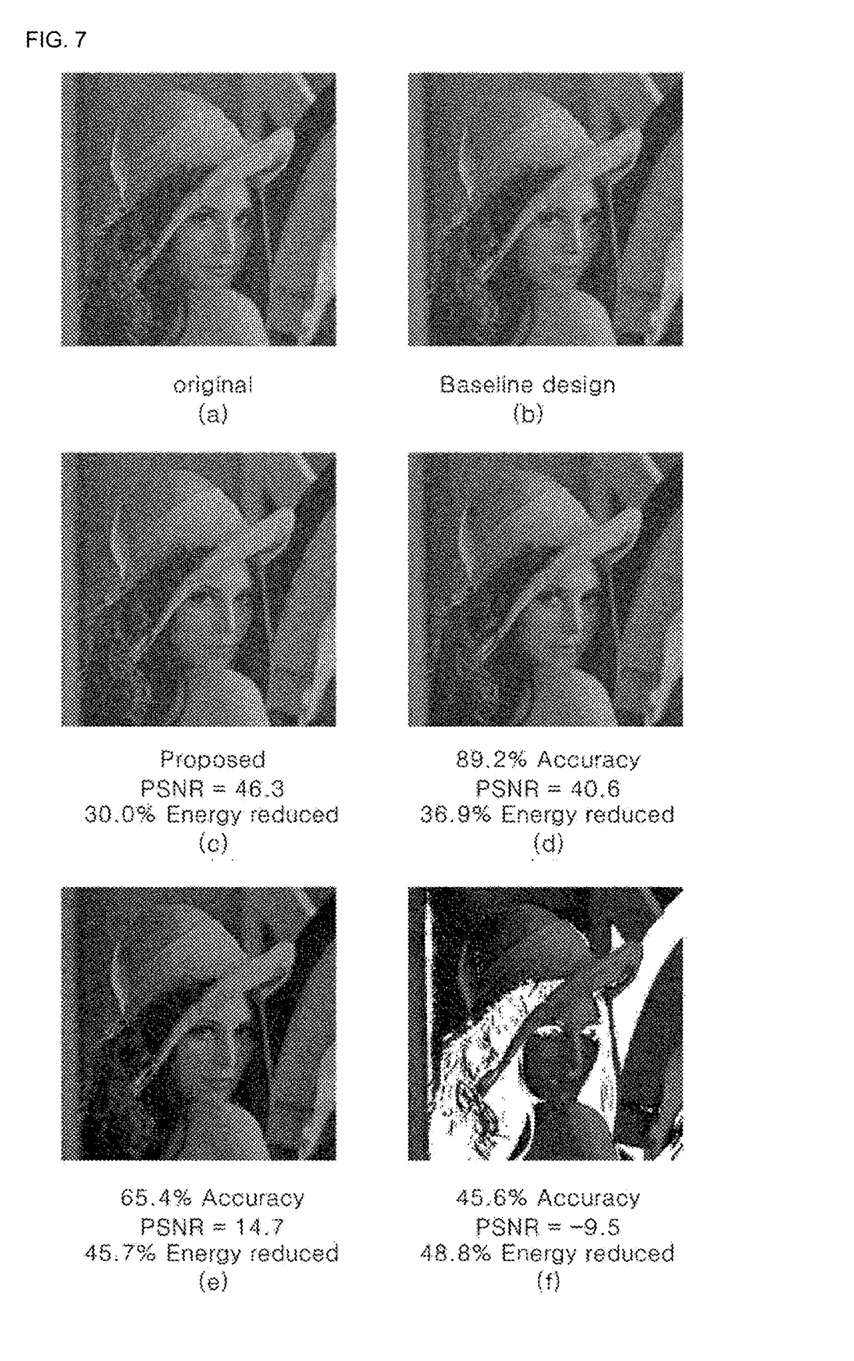
FIG. 7 is a photo showing images filtered using an optimized FIR filter.

Also, in the approximate synthesis flow, to verify the output quality of a processed image, peak signal-to-noise-ratio (PSNR) is defined by Equation 3:

$$PSNR = 10 \times \log\left(\frac{255^2}{\sigma_{noise}^2}\right), \quad (3)$$

where $\sigma_{noise}^2$ is the variance of the difference between (b) of FIG. 7 and others.

In the synthesis work according to the approximate synthesis flow, first, adders are classified according to an adder step so that optimum AP configurations in which energy consumption is reduced to the maximum while an appropriate level of accuracy is maintained in response to an adder step, and the number of approximate bits of the classified adders is initialized and then the adders are synthesized to calculate sensitivity and accuracy, and designs of the FIR filter are compared to one another through calculation of sensitivity and accuracy, and iteration of a design having largest sensitivity is designated as a seed of the next iteration, and the sensitivity is compared with a set value and determined. Here, the optimum range is a range in which the appropriate level of accuracy and energy consumption can be reduced to the maximum, as described above. A criterion for the optimum range may be properly set according to the type and design of the FIR filter.

Here, the number of approximate bits of the classified adders is initialized as "0".

Also, in synthesizing of the adders, the number of approximate bits of the adders in a first step is increased by 1 and then, maximum operating frequency is checked through synthesis, and accuracy is checked through simulation and then, sensitivity with respect to a variance of the number of approximate bits is calculated.

As described above, it is effective to apply the FIR filter circuit design method using approximate computing to images that do not require accuracy of 100%, search and image processing, and the FIR filter circuit design method using approximate computing can be applied to the FIR filter as digital filters for image processing.

Common Subexpression Elimination (CSE)

A common subexpression elimination (CSE) algorithm can reduce the design complexity of the FIR filter. With respect to the following terms used herein, Adder Step (AS) is the number of adders that are used to implement coefficients of the FIR filter, and Filter Adder Step (FAS) is the number of adders along a critical path of the FIR filter.

Figure 5:
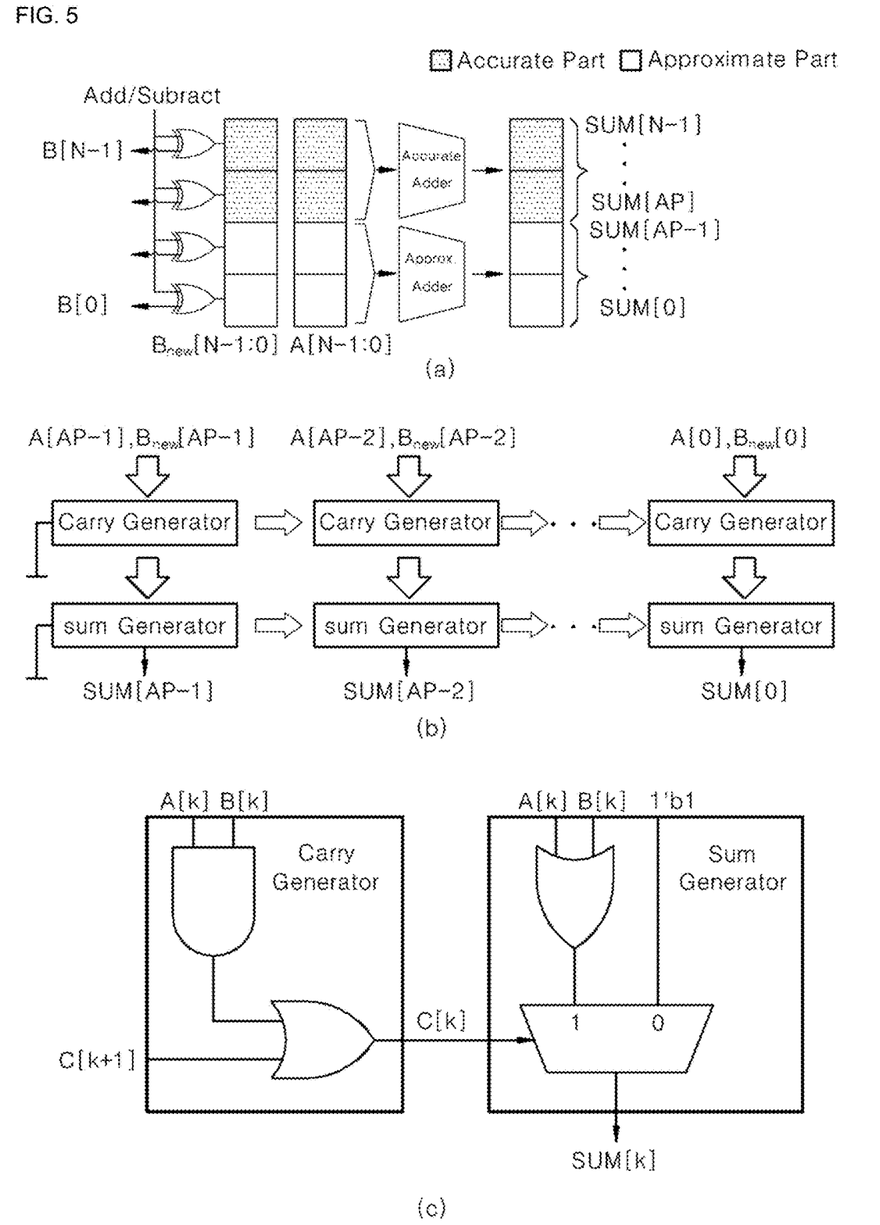
FIG. 5 is a circuit diagram of detailed characteristics of the FIR filter.
Figure 6:
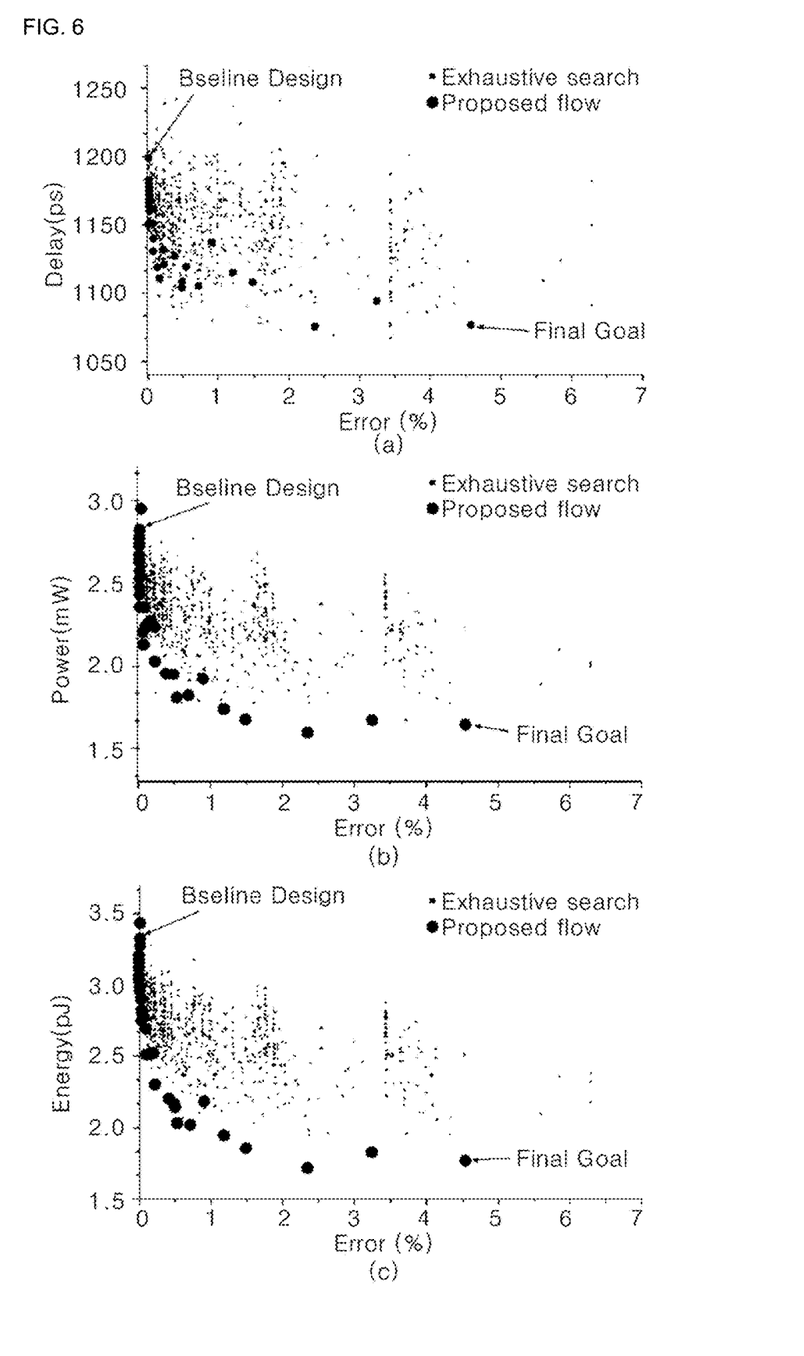
FIG. 6 is a graph showing repetitive results of an approximate synthesis flow.

At the beginning of the CSE algorithm, all coefficients are converted into canonical signed-digit codes and their consecutive zeros are eliminated using a right-shift operation. Set $C_N$ is constructed from the converted coefficients, and another set $N_C$ is constructed by decomposing $C_N$. At the first iteration of the CSE algorithm, each value in $C_N$ is checked to determine if it is decomposable by the other values in $C_N \cup \{1\}$. If the value is decomposable, it moves into a set $C_p$. Otherwise, the algorithm checks if the value is decomposable using values in $C_N \cup N_C \cup \{1\}$, and the decomposed value moves to $C_p$. The values in $N_C$, which are used in the decomposition, are moved to $C_N$. These procedures are repeated until $C_N$ is empty. Following the CSE algorithm, the CSD values in $C_p$ are used to synthesize the multiplier block in FIG. 5(b). For further explanation, we uses an example. Let FAS=4, the coefficients are $h_0=105_{(10)}=10\underline{1}01001_{(2)}, h_1=831_{(10)}=10\underline{1}01000001_{(2)}$ $h_2=621_{(10)}=1010010\underline{1}01_{(2)}, h_3=815_{(10)}=10\underline{1}010$
$\underline{1}0001_{(2)}.$ For simplicity, the CSD coefficients are expressed in integer format. Prior to the first iteration, $C_p=\phi$ $C_N=\{105,831,621,815\}$ $N_C=\{3,5,7,9,13,15,17,19,23,27,31,39,47,51,63,67,97,$
$\quad 109,113,123,125,127,129,137,155,159,193,209,$
$\quad 257, 273,493,497,509,513,625,637,641,751,676,$
$\quad 1007,1023, 1071,1087\}$ At the first iteration, 815 and 621 are decomposed by 831 and 105, $815=831-1\times2^4, 621=831-105\times2^1.$ respectively:

At the next step, 105 and 831 are decomposed. The result of the decomposition is follows, respectively:

$105=15\times2^3-15$ and $831=15\times2^6-129$

At the last step, 15 and 129 are decomposed:

$1\times2^4-1$ and $129=1\times2^7+1.$ $C_p=\{105,831,621,815,15,129\}$ $C_N=\phi$ $N_C=\{3,5,7,9,13,17,19,23,27,31,39,47,51,63,67,97,$
$\quad 109, 113,123,125,127,137,155,159,193,209,257,$
$\quad 273,493, 497,509,513,625,637,641,751,676,$
$\quad 1007,1023,1071, 1087\}$ The iterations terminate when $C_N$ is empty. The synthesized FIR filter from the CSE algorithm is shown in FIG. 2.

Approximate Computing

Approximate computing generates sufficiently good results using low power rather than exact results. It can be used for noise-tolerant applications. Various approximate arithmetic designs have been proposed in past research. Lu et al. introduced a fast adder with shorter carry chains that considers only the previous k bits of input in computing a carry bit. Verma et al. proposed a variable-latency speculative adder (VLSA), which is a reliable version of the Lu adder with error detection and correction. Shin et al. also proposed a data path redesign technique for various adders that reduces the lengths of critical paths in the carry chain. Zhu et al. proposed three approximate adders ETAI, ETAII, and ETAIIM. ETAI is divided into an accurate part and an inaccurate part to achieve approximate results. ETAII reduces carry propagation to speed up the adder, and ETAIIM modifies ETAII by connecting carry chains in accurate MSB parts. Gupta et al. conducted approximations at the transistor level, and proposed approximate full adder cells to design multi-bit adders for video applications to save power and area. Kahng et al. proposed an accuracy-configurable approximate (ACA) adder. In an approximate mode, the ACA adder carries out approximations by cutting carry chains. In an accurate mode, the ACA adder recovers accuracy by error detection and correction circuits. The ACA adder can save power consumption in the approximate mode and provide precise results in the accurate mode. Venkatesan et al. proposed a systemic design methodology for approximation computing that eliminates certain nodes from the original set of nodes, and analyzes how the eliminated nodes affect accuracy and power consumption through approximation. Several studies have been devoted to approximate multipliers. For digital signal processing (DSP) applications, fixed-width approximate multipliers have been proposed. They eliminate (W−1) least significant bits (LSBs) of (2W−1) partial products obtained from a W×W multiplication. Cho et al. and Wand et al. proposed carry approximation techniques in multiplication. Lu et al. proposed a broken-booth multiplier, but this has a low probability of yielding the correct result rate. Kulkarni et al. introduced an approximate multiplier based on 2×2 approximate multiplication with an error probability of 1/16. The simplified 2×2 approximate multiplier only has five unit cells, whereas the accurate one has eight unit cells. Not only does the simplification reduce the lengths of the critical paths of approximate multipliers, it also consumes less power and outperforms accurate multipliers.

Approximate Synthesis for FIR Filter (1) Proposed Approximate Adder/Subtractor

For the approximation of the FIR filter, we propose an accuracy-configurable adder/subtractor. The basic principle of the proposed adder/subtractor is fundamentally similar to the law of the adder proposed by Zhu. This adder detects carry generation conditions and generates "1" in all lower-sum bits without carry propagation to upper bits. To implement multiply and accumulate circuits, both adders and subtractors are required. XOR gates are added in front of the adder to switch between the adder and the subtractor. For exact subtraction operations, we should take 2's complement of the subtrahend by adding "1" to the 1's complement. The proposed approximate adder/subtractor, however, takes the 1's complement of the subtrahend as input because a carry in the approximate part is not propagated to the accurate part.

The adder is divided into two parts: an accurate part and an approximate part, as shown in FIG. 5A. A bit width of the adder is N, and a bit width of the approximate part is AP. The operating principle of the accurate part is identical to that of conventional adders. The structure of the approximate part is shown in FIG. 5B. The approximate part consists of AP-bit carry generators and AP-bit sum generators. As shown in FIG. 5B, the carry in the approximate parts is propagated from a most significant bit (MSB) of the approximate part to an LSB. The direction of carry propagation is the reverse of that in the conventional adders. FIG. 5C shows a schematic diagram of the carry generator and the sum generator. If the carry is generated from previous carry generators, the carry passes to the next one. Otherwise, two input operands are compared, and the carry is generated if both are "1." The sum generator receives a carry from the carry generator. If a carry exists, the sum generator returns "1." Otherwise, the sum generator adds two input operands and returns the sum value. The accuracy of the adder/subtractor is configurable by changing parameter AP and the bit width of the approximate part. AP can be configured from 0 to N. If AP is 0, the result of the proposed adder/subtractor is identical to that of the conventional adder/subtractor. If AP increases, the accuracy of the output is degraded, but power consumption is reduced or performance is improved. However, if AP is larger than a certain value, the propagation delay of the approximate part becomes that of the accurate part, and the benefits of further approximation are diminished. Hence, the AP value should be appropriately configured during approximate synthesis flow.

The maximum error in approximation occurs when all input bits in the approximate part are "1." In this case, the two input operands are $2^{AP}-1$. The outputs from the conventional adders are $(2^{AP}-1) \times 2$, whereas the approximate adder returns $2^{AP}-1$. In the results, the maximum error that can occur in the approximate adder is $2^{AP}-1$. On the contrary, if the approximate part is truncated, the maximum error is $(2^{AP}-1) \times 2$, which is twice that incurred by the proposed adder. For example, if N, AP, and the two inputs are 8, 4, $01101111_{(2)}$, and $00011111_{(2)}$, respectively, four MSBs are computed in the conventional part and four LSBs are added in the approximate part. The outputs from the accurate and approximate parts are $0111_{(2)} \times 2^4$ and $1111_{(2)}$, respectively, and the result is $01111111_{(2)}$ and $127_{(10)}$. Since the golden result of this addition is $10001110_{(2)}$ and $142_{(10)}$, the error is 15, which is equal to $2^4-1$. From the results, the amount of error can be reduced by using approximate adders when it compares to the truncation of some input bits.

To verify the quality of the output obtained by approximate computing, we use the accuracy metric, defined by Equation 1 as follows:

$$\text{accuracy} = \min_{k=1,\ldots,M} \left(1 - \frac{|\text{result}_k - \text{ref}_k|}{|\text{ref}_k|}\right) \times 100\%, \quad (1)$$

where M is the number of input patterns. The $\text{result}_k$ is an approximate result generated from the k-th input pattern, and $\text{ref}_k$ is the correct result.

(2) Approximate Synthesis Flow

Hereinafter, we describe the proposed approximate synthesis flow. The purpose of the synthesis flow is to find the optimum AP configurations of approximate adders. Using these optimum configurations, we can save energy power consumption and improve performance while maintaining a higher accuracy than a certain minimum constraint, $\text{accuracy}_{min}$. However, finding the optimally configured APs of the adders is difficult because the number of possible combinations of configurations is proportional to $M_{adder}^N$, where $M_{adder}$ is the number of adders and N is the bit width of the adders.

---

Algorithm 1 Sensitivity-based approximate synthesis flow.
---
1: Classify adders according to AS
2: $AP_i \leftarrow 0$, where $i = 1, \ldots$ ,FAS.
3: while $SF_{best} > 0$ do
4:    for i := 1 to FAS do
5:       $AP_i \leftarrow AP_i + 1$
6:       Synthesis $\{newAP_0, newAP_1, \ldots, newAP_{FAS}\}$
7:       Calculate $delay_i$
8:       Gate level simulation
9:       Calculate $accuracy_i$
10:      Power analysis
11:      Calculate $power_i$
12:      Calculate $SF_i$
13:      Recover design $AP_i \leftarrow AP_i - 1$
14:    end for
15:    $SF_{best} = \max(SF_1, SF_2, \ldots, SF_{FAS})$
16:    if $SF_{best} > 0$ then
17:       Select $\{AP_1, AP_2, \ldots, AP_{FAS}\}_{best}$
18:    end if
19: end while
20: Return $\{AP_1, AP_2, \ldots, AP_{FAS}\}$

---

Figure 4:
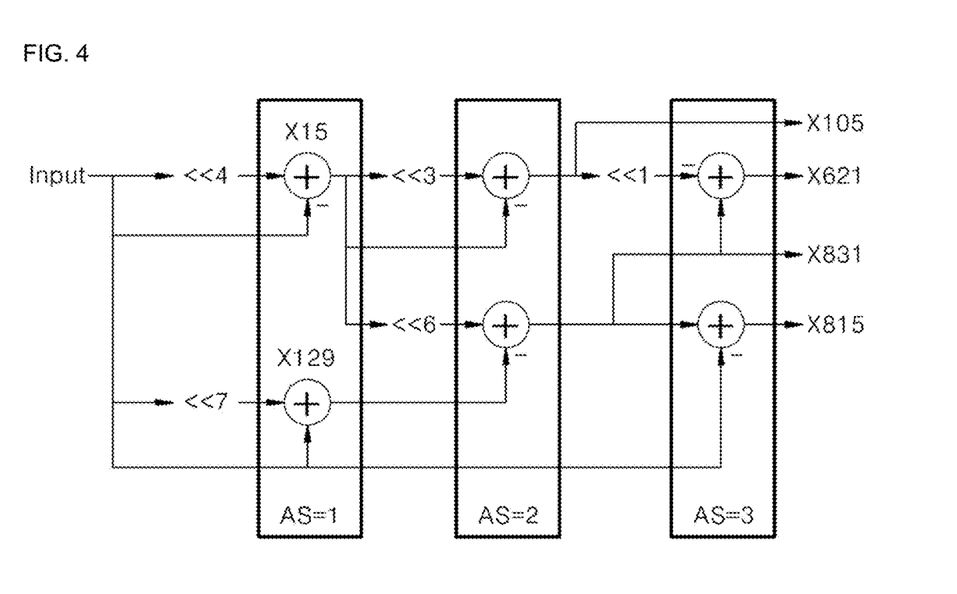
FIG. 4 is a circuit diagram of an FIR filter.

For further explanation, we uses the example in FIG. 4. The bit width of the input, the coefficients, and the output in the example are 15, 12, and 28 bits, respectively. The coefficients are (105, 831, 621, 815), synthesized from the CSE algorithm introduced above with FAS=3. Assuming that the $M_{adder}$ is 6 and N is 28 bits, the number of possible combinations of the APs is approximately $6.14 \times 10^{21}$. Since the size of the design of the example small and the number of adders is conventionally greater than six, the possible combinations of AP configurations in conventional FIR filters are considerably more in number than in this example. Searching all combinations is time and resource consuming, and is impossible in cases of larger designs.

To solve this problem, we make two assumptions. First, the delays in the adders are comparable to those in the subtractors. Second, the actual arrival time of an adder/subtractor is comparable to that of another adder/subtractor with the same AS. Hence, it is less effective to change APs in only one path than to simultaneously change the APs of adders. The number of possible combinations is then proportional to $FAS^M$. Considering that the FAS of the FIR filter is much smaller than that of $M^{adder}$, we can significantly reduce design space. Assuming FAS is 3 and N is 28 bits, the number of possible combinations of APs is $2.28 \times 10^{13}$. During approximate synthesis flow, AP is usually less than the half N, where the practical design space is approximately $FAS^{M/2}$ (4.7 million in this case), which is a more reasonable value than the number of all possible combinations, $6.14 \times 10^{21}$.

Algorithm 1 describes the procedure of our proposed approximate synthesis flow. The flow finds an approximate design with the minimum delay and the required accuracy (i.e., higher than $accuracy_{min}$). In the first step, the baseline design is loaded and all adders are classified according to their AS (Line 2). All APs of the AS are then set to 0 (Line 2). Following this, the AP in each AS is perturbed by adding 1 (Line 5). The perturbed Verilog design is synthesized, and the delay in the design is calculated (Lines 6-7). Using the synthesized design, a gate-level simulation and static timing analysis are performed to calculate the power and accuracy (Lines 8-11). From the slack and accuracy, the sensitivity factor (SF) is calculated (Lines 12). The SF is defined by Equation 2 as follows:

$$SF = \begin{cases} \dfrac{accuracy - accuracy_{min}}{delay}, & \text{if } accuracy > accuracy_{min} \\ 0, & \text{else} \end{cases} \quad (2)$$

where accuracy is defined in Equation 1. The calculated $SF_i$ is added to the SF list. Following calculations, the perturbed design is reverted to the original one (Line 13). If all perturbations and SF calculations are complete from the SF list, the design with a highest SF is selected (Line 15). The selected design is used as a seed for the next iteration (Line 16). If the highest SF is zero or negative, the flow returns a final solution, and ends. The proposed synthesis flow is summarized in FIG. 4. Low-power or highly energy-efficient design, which are our main concerns here, can be achieved by re-synthesizing the final solution of the synthesis flow with an appropriate clock constraint, i.e., the minimum available clock of the baseline design.

TABLE 1

Approximation results in 4-tap FIR filter with FAS = 3

|  | Delay [ps] | Power [uW] | Energy [fJ] |
|---|---|---|---|
| Baseline | 1199 | 2796 | 3352 |
| Flow result | 1076 | 1687 | 1815 |
| Min. Energy design | 1198 | 1379 | 1652 |

| | Improvement [%] | | |
|---|---|---|---|
| | Delay | Power | Energy |
| Flow result | 10.3 | 39.7 | 44.7 |
| Min. Energy design | 0.0 | 50.7 | 50.7 |

TABLE 2

Approximation results in 25-tap filter with FAS = 4

|  | Delay [ps] | Power [uW] | Energy [fJ] |
|---|---|---|---|
| Baseline | 1988 | 10.7 | 21.3 |
| Flow result | 1876 | 8.9 | 16.7 |
| Min. Energy design | 1983 | 8.2 | 16.3 |

| | Improvement [%] | | |
|---|---|---|---|
| | Delay | Power | Energy |
| Flow result | 5.6 | 16.8 | 21.6 |
| Min. Energy design | 0.0 | 23.3 | 23.5 |

Experimental Results
(1) Experimental Setup

We implement an FIR filter using our proposed approximate synthesis flow. We synthesize a four-tap FIR filter with the coefficient set {105, 831, 621, 815}. FIG. 2 shows the structure of the implemented FIR filter. In this experiment, the bit width of the coefficients is set to 12. Since the largest coefficient is 831 in the four-tap FIR filter, 12 bits are sufficient to represent four coefficients in SPT. The bit widths of the input and output are set to 15 bits and 28 bits, respectively. For addition, 28-bit adders are used. The four given coefficients are implemented using six adders according to the previously introduced CSE algorithm. The AS of each coefficient is different. The ASs of {15, 129} are 1, and those of {105, 831} are 2, and the ASs of {621, 815} are 3. In the first iteration of the synthesis flow, the accuracy configurations of the adders with the same AS are perturbed one by one. The perturbed designs ({1,0,0}, {0,1,0}, and {0,0,1}) are synthesized and simulated. {0,0,1}, which have the highest SF, is selected and set as seed of the following iteration. After several iterations, the final output is {11,16, 14}. FIGS. 5A, 5B, and 5C show an implemented design space using the proposed synthesis flow. The black dots are generated by randomly but separately configuring the AP of all adders. The red dots represent the results from iterations of the approximate synthesis flow. The white space shows the reachable design space with lower accuracy than accuracy$_{min}$ by configuring the APs of each adder. As shown in FIG. 5A, the proposed synthesis flow can successfully follow the minimum delay design. Moreover, it can be shown that the proposed synthesis flow can effectively reduce power and energy consumption.

Since the main concern of our work is obtaining high energy efficiency, we re-synthesize the design acquired from the synthesis flow and implement the design using different timing constraints. We then select the result with the lowest energy consumption with a delay not exceeding that of the baseline design. In FIG. 5A, due to EDA tool noise, one design with close to 97.5% accuracy shows slightly lower delay and power consumption than the final solution design. Following re-synthesis, however, the energy consumption of the point is greater than that of the final solution.

Table 1 summarizes the results of the approximate synthesis flow. Performance improves by 10.3%, and power consumption is reduced by 39.7% over conventional FIR filter design. The energy is calculated by multiplying delay and power. Energy consumption per operation is reduced by 44.7%. To achieve further energy reduction, we change the timing constraint and find the minimum energy design for which delay is shorter than the baseline design. In this way, we achieve up to 50.7% reduction in energy consumption. The runtime of the proposed synthesis flow is 84 minutes for the four-tap FIR filter.

We apply the approximate synthesis flow to a 25-tap FIR filter, the coefficients of which are {−2423, −113, 1564, 762, −1816, −1517, 2276, 3140, −2434, −6205, 2726, 20680, 30093, 20680, 2726, −6205, −2434, 3140, 2276, −1517, −1816, 762, 1564, −113, −2423}. The results are shown in Table 2. In the 25-tap case, we can improve the performance by 5.6% with power and energy savings of up to 23.3% and 23.5%, respectively. The runtime of the proposed synthesis flow is 407 minutes for the 25-tap FIR filter.

TABLE 3

Specifications of the FIR filters

| FIR Filter | Tap | FAS | Delay [ns] | Power [mW] | Energy [pJ] |
|---|---|---|---|---|---|
| [21] | 15 | 3 | 0.98 | 5.68 | 5.5 |
| [22] | 15 | 4 | 1.27 | 4.06 | 5.1 |
| [23] | 28 | 4 | 1.15 | 11.6 | 13.4 |
| [24] | 34 | 3 | 1.17 | 13.4 | 15.7 |
| [25] | 49 | 3 | 1.20 | 18.4 | 22.1 |

TABLE 4

Following the proposed synthesis flow

| FIR Filter | Accuracy [%] | Delay [ns] | Power [mW] | Energy [pJ] | Energy Reduction [%] |
|---|---|---|---|---|---|
| [21] | 97.83 | 0.93 | 4.34 | 4.06 | 26.9 |
| [22] | 95.32 | 1.14 | 3.17 | 3.62 | 29.5 |
| [23] | 96.03 | 1.15 | 8.13 | 9.34 | 30.1 |
| [24] | 95.66 | 1.15 | 8.34 | 9.59 | 38.9 |
| [25] | 95.19 | 1.12 | 13.60 | 15.27 | 30.8 |

(2) Image FIR Filter Experiment

To verify our methodology, we apply the proposed synthesis flow to five different FIR filters [21-25]. The specifications of the FIR filters are summarized in Table 3. The delay, power, and energy information of the baseline designs of the FIR filters are also summarized in Table 3. The FIR filter is synthesized using the proposed synthesis flow, whereas the bit width of the inputs, the coefficients, and the output width are set to eight, 16, and 24 bits, respectively. The results of the synthesis flow are shown in Table 4. The accuracies of the filters are higher than the threshold of 95%. The energy consumptions of the FIR filters are reduced by up to 38.9% and 31.2% on average.

An FIR low-pass filter is implemented in [23] for blurred images. Since the image used is two-dimensional, we apply the FIR filter first in the vertical direction, and divide the output by filter gain. Following this, the FIR filter is applied in the horizontal direction, and the output is divided by filter gain once again. FIG. 7A shows the original image and FIG. 7B shows the blurred image processed by the baseline FIR filter. FIG. 7C shows the image processed by the proposed FIR filter. To verify the output quality of the processed image, peak signal-to-noise-ratio (PSNR) is used. PSNR is defined by Equation 3 as follows:

$$PSNR = 10 \times \log\left(\frac{255^2}{\sigma_{noise}^2}\right), \quad (3)$$

where is the variance of the difference between FIG. 7B and others. FIR filters with varying accuracies are simulated. As accuracy decreases, the image becomes dark. This is because the proposed adder approximates the previous carry and the approximation error renders the result lower in value than the exact result. If the approximation error continues to increase, the results assume negative values, which are expressed as white dots. We find that we are able to achieve 30.8% energy saving with 46.3 dB PSNR.

CONCLUSIONS

We apply approximate computing to an FIR filter to enhance efficient energy consumption. The FIR filter has a MAC structure, and multipliers are replaced by shifters and adders/subtractors that are approximated. For the approximation, we propose an approximate adder/subtractor in order that the accuracy of the approximate adder/subtractor is configurable and switching between the adder and the subtractor is possible. The error in the proposed approximate adder is analyzed. Moreover, we propose a novel approximate synthesis flow that can find the optimal configurations of approximate adders. Using the proposed synthesis flow, we achieve up to 10.3% in terms of performance improvement and 50.7% in terms of power and energy saving over conventional FIR filter design.

As described above, the FIR filter circuit design method using approximate computing according to the present invention provides the following effects.

First, in the FIR filter, conventional adders/subtractors are replaced with addition/subtraction having an automated synthesis flow so that energy consumption can be reduced.

Second, power consumption is reduced so that energy-efficient and an appropriate level of accuracy is improved, and the maximum errors incurred due to configurations of addition/subtraction are analyzed to verify the quality of output.

Third, by using an approximate synthesis flow, a function of reducing energy/power consumption and maintaining a reasonable level of accuracy can be improved.

Fourth, as the mobility of computer systems becomes more significant, a further reduction in power consumption of components is required. Thus, by using approximate computing, power consumption can be reduced.

Fifth, energy efficiency of the FIR filter can be improved through approximate computing, and approximate synthesis technology for a high-efficiency FIR filter having an acceptable level of accuracy can be provided.

Sixth, the FIR filter is implemented using the CSE algorithm, and the existing addition/subtraction is replaced with approximate addition/subtraction so that an acceptable level of accuracy can be output and energy consumption of 50.7% can be achieved over conventional FIR filter design.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A finite impulse response (FIR) filter circuit design method using approximate computing, the FIR filter circuit design method comprising:
   replacing adders of a FIR filter with approximate adders; and
   performing a synthesis work according to a set approximate synthesis flow when the replacing of the adders of the FIR filter are replaced with the approximate adders is performed,
   wherein, in the set approximate synthesis flow, the approximate adders are divided into an accurate part and an inaccurate part, and the inaccurate part is approximated,
   wherein the synthesis work according to the set approximate synthesis flow comprises:
   classifying adders;
   initializing a number of approximate bits of the classified adders;
   synthesizing the adders to calculate sensitivity and accuracy;
   comparing designs of the FIR filter to one another through calculation of sensitivity and accuracy, and designating iteration of a design having largest sensitivity as a seed of a next iteration; and
   comparing the sensitivity with a set value and determining an updated sensitivity.

2. The FIR filter circuit design method of claim 1, wherein, in the set approximate synthesis flow, the accuracy is defined by Equation 1:

$$\text{accuracy} = \min_{k=1,\ldots,M}\left(1 - \frac{|result_k - ref_k|}{|ref_k|}\right) \times 100\%, \quad (1)$$

where $result_k$ is an approximate result generated from a k-th input pattern, and $ref_k$ is a correct result.

3. The FIR filter circuit design method of claim 1, wherein, in the set approximate synthesis flow, the sensitivity is defined by a sensitivity factor (SF) which is defined by Equation 2:

$$SF = \begin{cases} \dfrac{\text{accuracy} - accuracy_{min}}{\text{delay}}, & \text{if accuracy} > accuracy_{min} \\ 0, & \text{else} \end{cases} \quad (2)$$

4. The FIR filter circuit design method of claim 1, wherein, in the set approximate synthesis flow, to verify an output quality of a processed image, peak signal-to-noise-ratio (PSNR) is defined by Equation 3:

$$PSNR = 10 \times \log\left(\frac{255^2}{\sigma_{noise}^2}\right), \quad (3)$$

where $\sigma_{noise}^2$ is a variance of a difference.

5. The FIR filter circuit design method of claim 1, wherein the initializing of the number of approximate bits of the classified adders comprises initializing the number of approximate bits of the classified adders as "0".

6. The FIR filter circuit design method of claim 1, wherein the comparing of the sensitivity with a set value and determining of the sensitivity comprises, when the sensitivity is smaller than 0, performing an operation of calculating sensitivity and accuracy by synthesizing the adders, again.

7. The FIR filter circuit design method of claim 1, wherein the synthesizing of the adders comprises:
   increasing the number of approximate bits of the adders in a first step by 1;
   checking maximum operating frequency through synthesis;
   checking accuracy through simulation; and
   calculating sensitivity with respect to a variance of the number of approximate bits.

\* \* \* \* \*